(12) United States Patent
Topper et al.

(10) Patent No.: US 11,982,580 B2
(45) Date of Patent: May 14, 2024

(54) DIELECTRIC ELASTOMER TRANSDUCER AND CORRESPONDING FABRICATION PROCESS

(71) Applicant: Universitat Basel Vizerektorat Forschung, Basel (CH)

(72) Inventors: Tino Topper, Freiburg (DE); Bekim Osmani, Basel (CH); Bert Mueller, Embrach (CH)

(73) Assignee: Universität Basel Vizerektorat Forschung, Basel (CH)

( * ) Notice: Subject to any disclaimer, the term of this patent is extended or adjusted under 35 U.S.C. 154(b) by 842 days.

(21) Appl. No.: 16/976,908

(22) PCT Filed: Mar. 1, 2019

(86) PCT No.: PCT/EP2019/055157
§ 371 (c)(1),
(2) Date: Aug. 31, 2020

(87) PCT Pub. No.: WO2019/166635
PCT Pub. Date: Sep. 6, 2019

(65) Prior Publication Data
US 2021/0041310 A1 Feb. 11, 2021

(30) Foreign Application Priority Data
Mar. 1, 2018 (EP) .................... 18159591

(51) Int. Cl.
*G01L 1/14* (2006.01)
*H10N 30/098* (2023.01)
(Continued)

(52) U.S. Cl.
CPC ........... *G01L 1/146* (2013.01); *H10N 30/098* (2023.02); *H10N 30/206* (2023.02); *H10N 30/857* (2023.02)

(58) Field of Classification Search
CPC .... G01L 1/146; H10N 30/098; H10N 30/206; H10N 30/857
See application file for complete search history.

(56) References Cited

U.S. PATENT DOCUMENTS

2006/0196702 A1* 9/2006 Hansen .............. G01G 19/4142
177/210 C
2015/0268106 A1* 9/2015 Otaka .................. G06F 3/0445
73/780
(Continued)

FOREIGN PATENT DOCUMENTS

CN 109341902 A * 2/2019 .............. G01L 1/00
WO 2010054114 5/2010
WO 2015055336 4/2015

OTHER PUBLICATIONS

Duranti, Mattia et al., "A new class of variable capacitance generators based on the dielectric fluid transducer", Smart Materials and Structures, IOP Publishing Ltd., Bristol, GB, vol. 26, No. 11, 18 pages, Oct. 9, 2017.
(Continued)

Primary Examiner — Francis C Gray
(74) Attorney, Agent, or Firm — Volpe Koenig

(57) ABSTRACT

For improving the sensitivity, lifetime and energy consumption of a dielectric elastomer transducer (1) to be used as a sensor, it is suggested that a dielectric layer (3) enclosed by two electrodes (2) of the transducer (1) includes a nanoscale volume of a fluid (15) such that the dielectric layer (3) is rendered compressible and/or displaceable out of a volume enclosed by the two electrodes (2). The advantage of such a design is that, although the dielectric layer (3) and possible buffer layers (4) separating the electrodes (2) from the dielectric layer (3) may all have thicknesses in the order of a few μm or even in the sub-μm range, the transducer (1) is rendered highly compliant due to the movability of the fluid
(Continued)

(15). In consequence, a large nominal capacitance of the transducer (1) as well as a large relative capacitance change (up to twenty times that of the nominal capacitance) can be achieved in conjunction with a very high sensitivity.

16 Claims, 5 Drawing Sheets

(51) Int. Cl.
*H10N 30/20* (2023.01)
*H10N 30/857* (2023.01)

(56) References Cited

U.S. PATENT DOCUMENTS

| | | | | |
|---|---|---|---|---|
| 2015/0276531 | A1* | 10/2015 | Matsuhiro | G01D 5/241 |
| | | | | 73/718 |
| 2016/0018275 | A1* | 1/2016 | Kaneko | G01B 7/22 |
| | | | | 73/862.626 |

OTHER PUBLICATIONS

Topper, Tino, et al., "Time-Resolved Plasmonics used to On-Line Monitor Metal/Elastomer Deposition for Low-Voltage Dielectric Elastomer Transducers", Advanced Electronic Materials, vol. 3, No. 8, 10 pages, Jun. 12, 2017.

* cited by examiner

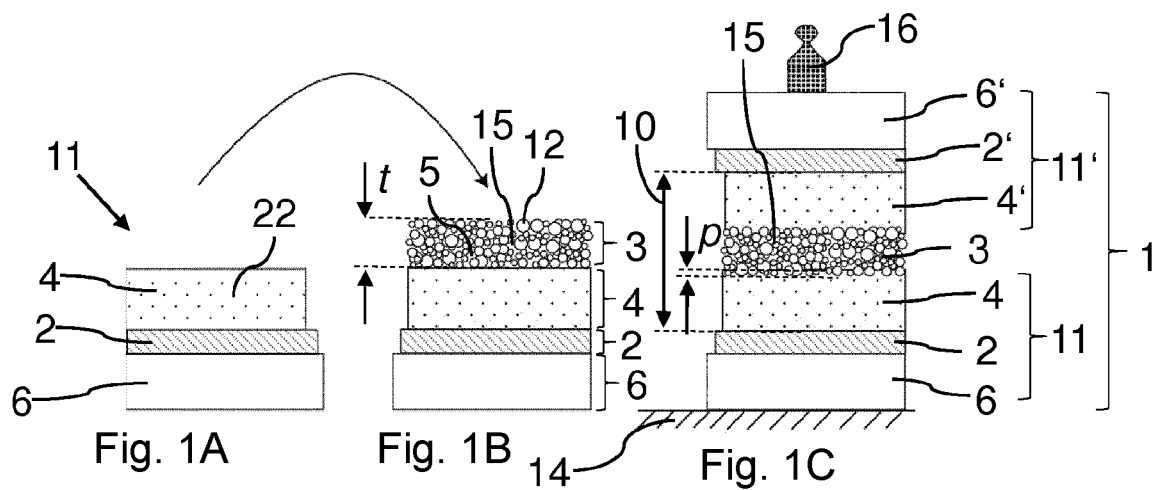
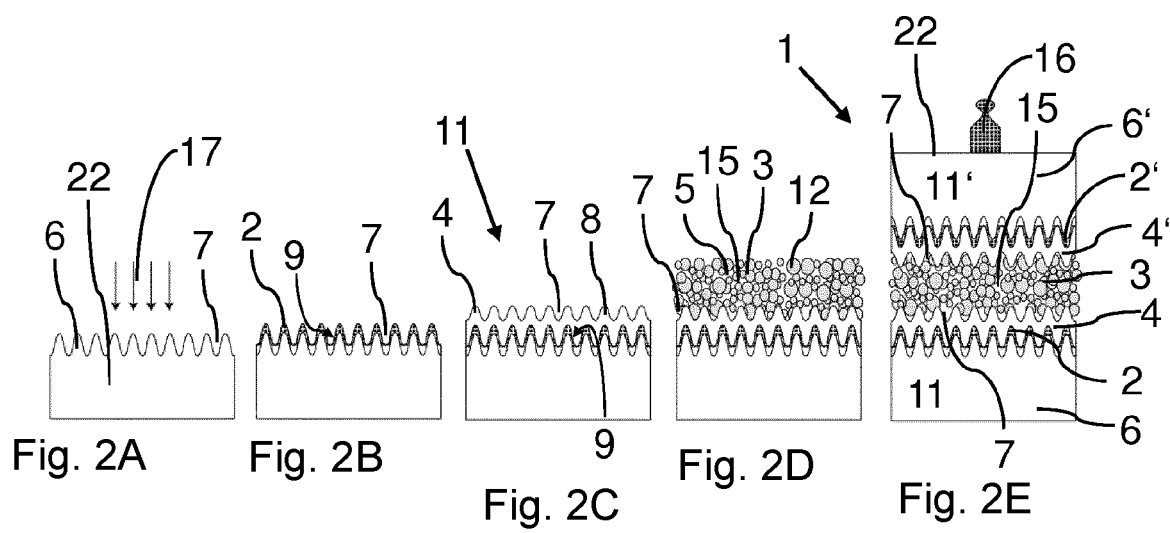
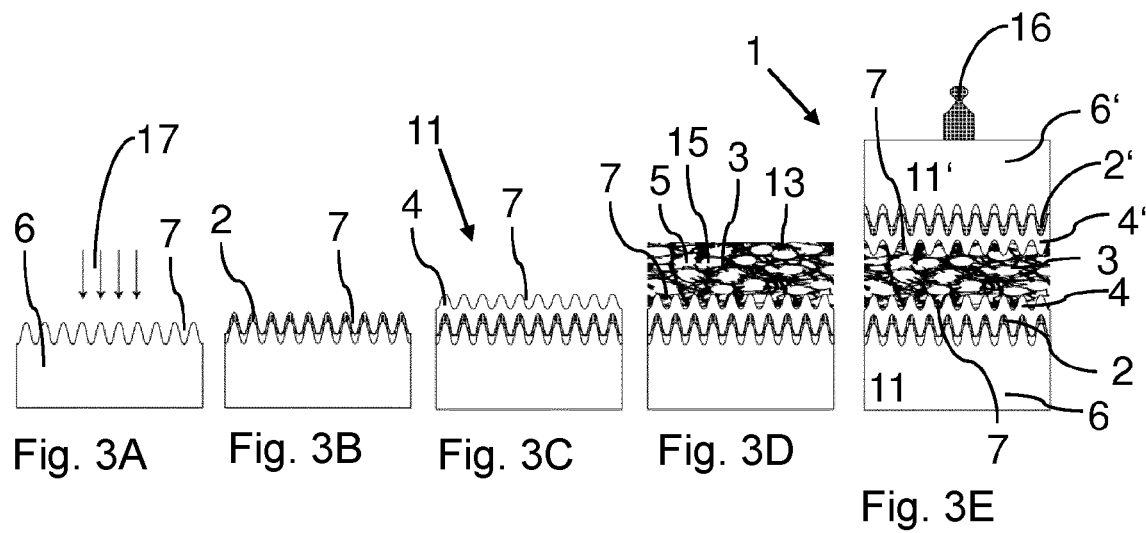

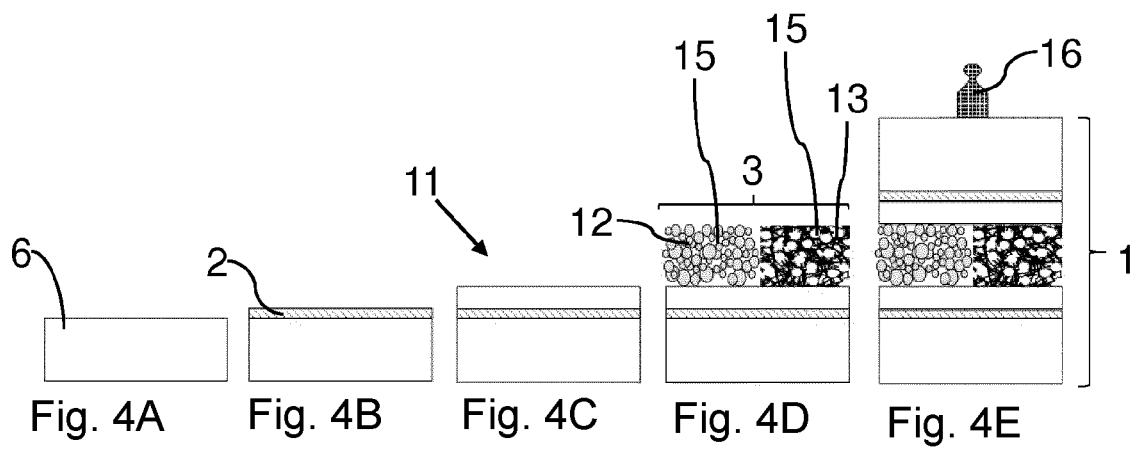
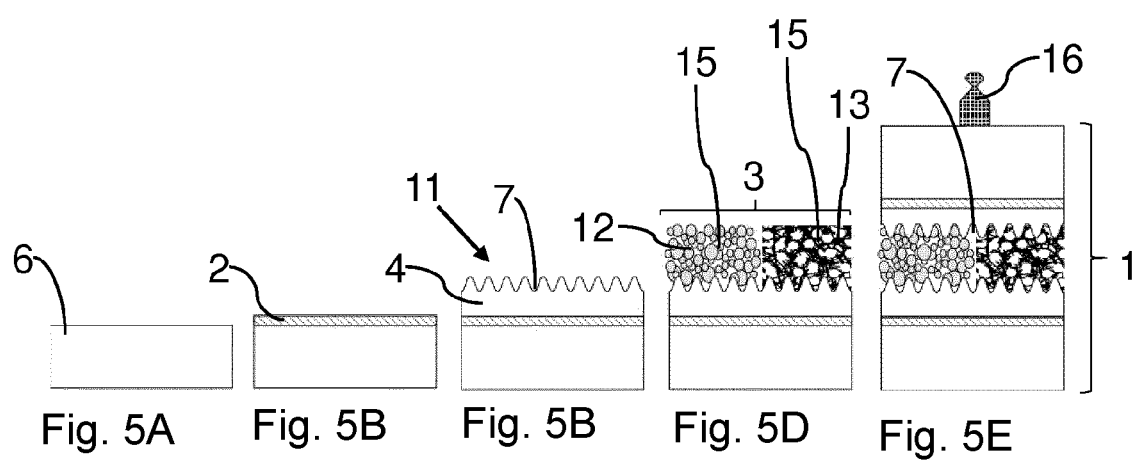

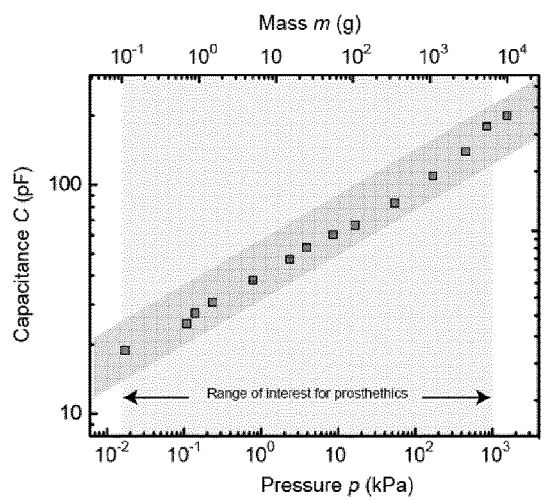
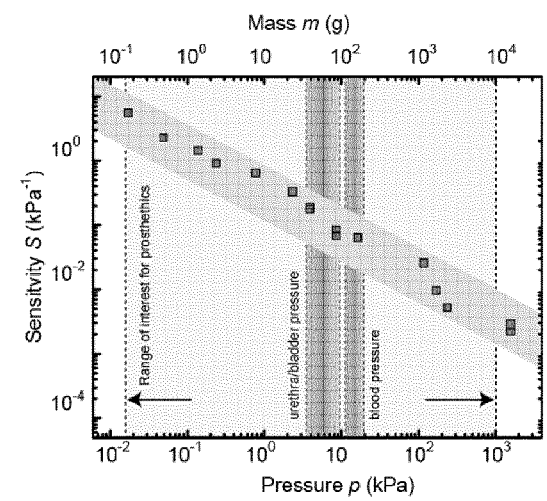
Fig. 11A          Fig. 11B
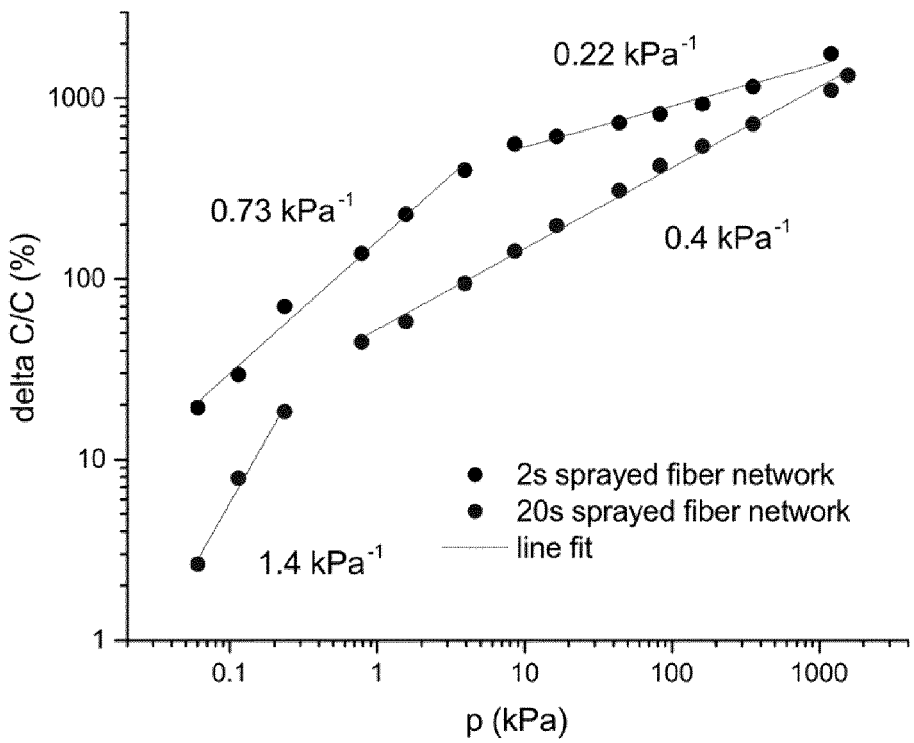
Fig. 12

DIELECTRIC ELASTOMER TRANSDUCER AND CORRESPONDING FABRICATION PROCESS

TECHNICAL FIELD

The present disclosure concerns a (miniaturized) dielectric elastomer transducer, abbreviated as DET, comprising a dielectric layer sandwiched between two opposing electrodes, wherein at least one of the two electrodes is applied on an elastomer. In addition, an array of such DETs is disclosed and a novel process for fabricating a DET comprising an elastic buffer layer separating a dielectric layer from an electrode is revealed.

BACKGROUND

Dielectric elastomer transducers (DETs) are widely employed as sensors, actuators or energy harvesters. Due to their ability of delivering high energy output, high strains and high mechanical compliance, or high sensitivity while being lightweight, low-cost and tolerant to damages, DETs have been introduced in applications ranging from robotics, automation, optics, micro-actuation to biomedical devices. In particular for sensor applications, DETs have recently made a large progress in terms of practicability and usability. Nevertheless, there is still a large need for a DET-sensor that offers a high nominal capacitance, a very high electromechanical sensitivity (over a broad range of pressures) along with excellent long-term stability, can be operated a low voltages, and excels in an ultra-low energy consumption. As such technical properties are of high importance in numerous applications, in particular medical applications, the object of the present invention is to deliver a DET-sensor with such properties.

SUMMARY

In accordance with the present invention, a sensor with a dielectric elastomer transducer is provided, which satisfies the afore-mentioned need. In particular the invention proposes a sensor with dielectric elastomer transducer as introduced at the beginning, which, in addition, is characterized in that the dielectric layer comprises a fluid. The volume ratio of the fluid in the dielectric layer can be up to 100%. In other words, in particular embodiments the dielectric layer may consist of a fluid. The fluid may be in particular an incompressible fluid, for example a liquid such as silicone oil.

A fluid in the sense of the invention may be any substance that continually deforms (flows) under an applied shear stress. The fluid may thus be a liquid or a gas or even a solid which is capable of flowing.

As a major advantage of the invention, the dielectric layer is rendered highly compliant resulting in a high degree of possible changes of the volume enclosed by the two electrodes: When a force, for example in the form of a distributed mechanical load, is acting on the DET, the dielectric layer is able to rapidly change its shape such that a large (up to five orders of magnitude) capacitance change (over a broad range of applied pressures) can be achieved. As the fluid cannot resist the applied force, in particular the shear forces resulting from an applied load, the deformation of the DET is achieved easily and rapidly (ms response times). Due to the large capacitance change, which may be up to 20 times that of the nominal capacitance, a high sensitivity can be achieved.

The elastomer, on which at least one of the two opposing electrodes is applied, may be a substrate, in particular a stretchable and/or elastic substrate, or a buffer layer, whose characteristics will be detailed below.

The opposing electrodes may be congruent or incongruent and they may also be spatially shifted against each other, depending on the particular design. Moreover, single electrodes of the DET may be deposited on a support substrate or, for example if used as an top electrode or an intermediate electrode, on a buffer layer. In general, it is recommended to employ a nanometer-thin and preferably soft adhesion promoter as the interface between electrode and substrate or between electrode and buffer layer.

According to the invention, there exist further advantageous embodiments solving the aforementioned problems, which are outlined in the sub-claims and described in detail in the following. For example, one particular design of a DET according to the invention suggests that the dielectric layer (as a whole), in particular the fluid, is compressible. For example, the dielectric layer may be made up by a compressible fluid (e.g. air) entirely. Or the dielectric layer may be composed of a compressible material, such as a loose polymer network, in particular consisting of fibers (preferably with diameters below 10 µm, most preferably below 1 µm), and using an incompressible but displaceable liquid as the fluid.

Alternatively or additionally, the dielectric layer, in particular the fluid, may be laterally displaceable. Lateral displacement may be understood here, as describing a movement of the dielectric, in particular the fluid, in a direction perpendicular to an actuation direction of the opposing electrodes. As will be explained in more detail below, this particular ability of the dielectric layer offers numerous advantages for DET-design with very high sensitivity. For example, with such properties of the DET, loads in the order of Pa can be resolved.

For increasing the long term stability of the DET, another embodiment suggests that the dielectric layer is separated from at least one, preferably from both, of the two opposing electrodes by an elastic and/or deformable buffer layer, respectively. A DET according to the invention may thus feature a single or at least two separate buffer layers. Deformable may mean here the ability to alter a shape due to applied mechanical stress.

Generally, the buffer layer may be a dielectric; however, it is conceived that a working DET may also be obtained, if the buffer layer is (weakly or strongly) conducting; nevertheless, most suitable materials offering the necessary elasticity will be non-conducting.

The choice of materials used for the DET may be further such that the buffer layer(s) is/are elastically incompressible (i.e. featuring a Poisson ratio that approaches a value of 0.5). This is the case, for example, if polydimethylsiloxane (PDMS) is used as the material for the buffer layer (but not, for example, a material comparable to dough, which may be incompressible but is not elastic). Of advantage in such a design is that the deformation of the DET as a whole is rendered reversible.

As a major advantage of the invention, a buffer layer as detailed above can compensate strain which is produced when the DET is compressed (e.g. due to an external force acting on the DET). Hence a mechanical decoupling between the electrodes 2 and the dielectric layer is achieved. A second possible functionality of the buffer layer is to seal the fluid contained or comprised in the dielectric layer. Both of these functionalities are decisive for achieving long-term stable operation of the DET as proposed herein.

In yet another advantageous embodiment, the dielectric layer is porous. In particular, the dielectric layer may contain nanoscale voids, which are filled by the fluid. The porosity of the layer may thus be the result of a mixture of a first solid component (e.g. a powder, a sponge-like network of nanoscale fibers, etc.) and a second fluidic component (i.e. a gas or a liquid), with both components forming the dielectric layer.

In such a design, the degree of porosity of the dielectric layer may be altered, depending on the application. For example, when varying the ratio of the nanoscale voids to the size of nanoparticles of the dielectric layer or to the characteristic size of polymer chains of a polymer network of the dielectric layer, the sensitivity of the DET may be fine-tuned: The more porous the dielectric layer, the more sensitive the DET will be for detection of small forces. On the other hand, a small degree of porosity will render the DET sensitive to large forces. In addition, the pressure range of highest sensitivity can be adjusted by the porosity of the dielectric layer and the Young's moduli of the nanoparticles or nanofibers.

By using a porous dielectric, it may be further achievable that the dielectric layer itself is reversibly compressible. When the DET is deformed, the dielectric layer may thus produce a restoring force, in particular such that a distance between the two opposing electrodes (inter-electrode-distance) increases once the load is removed from the DET. Reversibility can thus be understood here as the capability of the dielectric layer of undergoing numerous cycles of alternating compression and expansion, due to applied or relieved forces acting on the DET, respectively.

The benefit of the porosity of the dielectric layer is hard to grasp a first sight but can be explained: The general concept of the invention for achieving a high sensitivity of the DET-sensor relies on two factors: first, using a device structure which offers a high nominal sheet capacitance (nF/cm^2); and second, creating a large relative capacitance change.

According to the invention, the first factor can be achieved by using materials with high permittivity $\varepsilon$ for the dielectric layer and the buffer layers and applying them in very thin layers, as will be explained in more detail below; the second factor may be accomplished by changing the effective dielectric permittivity of the dielectric layer employed in the DET, as will be explained in the following:

For the exemplary case of a simple DET consisting of two planar electrodes and a dielectric material of thickness d sandwiched between two opposing electrodes, the capacitance C can be approximated as $$C = A \frac{\varepsilon_0 \varepsilon_r}{d},$$

where d is the inter-electrode distance between the two opposing electrodes and $\varepsilon_0$, $\varepsilon_r$ are the permittivity of vacuum and the dimensionless relative permittivity of the dielectric material, and A the area of one electrode, respectively.

Building on this example, the central idea of the invention is to employ an ultra-thin layer of a porous and compressible material as the dielectric of the capacitor formed by the DET. Ideally, the dielectric layer of the DET according to the invention should consist of a core material of high absolute permittivity $\varepsilon$, for example nanoscale particles of barium titanate ($BaTiO_3$), with nanoscale volumes of a dielectric fluid of low permittivity embedded in the layer, for example air or a liquid.

When applying pressure on the DET, the fluid will be compressed (e.g. in case the fluid is a gas) or displaced laterally (e.g. in case the fluid is a liquid) or both. In all cases, the volume fraction of the core material in the dielectric layer will increase locally and, as a result, the relative permittivity $\varepsilon_r$ of the dielectric layer and therefore also the absolute permittivity $\varepsilon = \varepsilon_0 \varepsilon_r$ of the dielectric layer will increase locally. At the same time, due to the compression and/or displacement of the fluid, the inter-electrode-distance d will decrease.

As can be readily understood from the exemplary equation cited above, both effects will lead to a substantial increase of the capacitance C=c A of the DET, since the sheet capacitance c=$\varepsilon$/d of the dielectric layer increases.

One might ask whether it is not possible to achieve a similar sensor performance using a deformable polymer such as PDMS as the dielectric layer of the DET. However, in particular when using ultra-thin films of only a few μm in thickness, as required for a high nominal sheet capacitance of the DET, there is virtually no deformation possible when a force is applied locally onto such a film. The underlying reason is that PDMS (as wells a many other rubber-like materials) is virtually elastically incompressible, due to a Poisson ratio approaching the ideal value for an incompressible material of 0.5. In consequence, for achieving a vertical deformation of the film, the PDMS-film would need to flow laterally, a situation comparable to an incompressible liquid to be pressed through a micro-channel of mm-length but a channel height of only a few μm. It appears obvious, that due to the high viscosity of (even only partially cross-linked) PDMS, the resulting flow resistance is so high that virtually no substantial lateral flow and hence no substantial vertical deformation of the film and a DET based on such a film can be obtained.

The invention solves this issue by providing a dielectric layer which is specifically designed to be compressible (by making use of porosity and/or compressible fluids) or at least laterally displaceable (e.g. by using a liquid as the fluid).

Seen from another perspective, the invention suggests to employ a dielectric that consists of two components of differing permittivities. In addition, these two components should be movable against each other. This approach enables a strong relative capacitance change by varying not only the inter-electrode distance d but also the local composition of the dielectric layer during actuation of the sensor.

As explained above, the DET according to the invention features at least one, preferably two, additional buffer layers, which are located in between the dielectric layer and the respective electrode. In case these buffer layers are dielectric, they reduce the total capacitance of the DET, which, in general, is detrimental for achieving a high nominal capacitance of the DET. Hence, in this case the thickness of the buffer layer(s) should be as low as possible, but still large enough to enable compensation of stress produced during compression of the dielectric layer. As a rule of thumb, the thickness of the buffer layer(s) should be in the same order of magnitude as the thickness of the dielectric; preferably, however, the buffer layer(s) is/are thinner than the dielectric layer according to the invention.

As was already explained, the dielectric layer may consist of a fluid, in particular entirely. In some particular embodiments, the dielectric layer, in particular the fluid, may be encapsulated in micro-cavity formed between the two opposing electrodes. This micro-cavity may be deformable and/or closed such that upon deformation of the DET, the fluid cannot be driven out of the micro-cavity but remains trapped inside the micro-cavity. To maximize the possible deformation of the DET in such a design, it is preferable to use a compressible fluid.

For profiting from the displaceability of the fluid used in the DET, another particular design with very high sensitivity suggests that the DET comprises at least one receptacle in fluid communication with the dielectric layer, (in particular an open micro-cavity taking up the dielectric layer) into which the fluid is displaceable. Preferably, the receptacle is such that it can be reversibly deformed. In this case, the deformation of the receptacle can support the actuation cycle of the DET, in particular when a pressure applied to the DET is removed.

For achieving a rapid response of the DET in the order of ms, it is generally preferable to use a fluid with a low viscosity. For example, the viscosity may be ten times, or even hundred times lower than the viscosity of water at room temperature.

In particular the receptacle may be formed by a, preferably dielectric, material, which is porous. Additionally or alternatively, the receptacle may contain voids, which are nanoscale and/or filled with a fluid. This fluid may be in particular the same as the fluid used in the dielectric layer of the DET.

Preferably the receptacle may adjoin the dielectric layer, in particular the volume enclosed by the electrodes. By the latter properties, a direct fluidic cross-talk between the DET and the receptacle can be build up and a compact foot-print of the DET can be achieved, resulting in a rapid mechanical response of the DET and high spatial and absolute sensitivity.

By equipping the DET with a receptacle, it can be further achieved that a part of the fluid comprised in the dielectric layer (or forming part of the dielectric layer) is forced into the receptacle as soon as a pressure is applied on the DET. In addition, the receptacle may comprise a resilient member. This resilient member may restore an initial volume (e.g. the volume enclosed between the two opposing electrodes before application of a force to the DET), as soon as a pressure is removed from the DET. As a result, the resilient member may support the back-driving of the fluid, such that said part of the fluid that was driven into the receptacle is transferred back into the dielectric layer. The resilient member may be formed, for example, by a polymer network.

According to another embodiment, the design of the DET can be such that the dielectric layer has a dimension parallel to the electrodes that is at least 100 times, preferably 1000 times, a thickness t of the dielectric layer. For example, the total thickness of a DET structure may be a few μm, while the sensing area of the DET may be in the order of mm². Such designs make it possible to use the DET as an ultra-thin deformable sensor film, i.e. a kind of "artificial skin", which is attractive for many applications, for example electronic skins for human machine interfaces. Another preferred embodiment suggests that the dielectric layer contains nanoscale particles, in particular with a relative permittivity $\varepsilon_r$ of more than 500. These nanoscale particles may have diameters of less than 500 nm, most preferably of less than 100 nm. As a result, the dielectric layer can be a few μm thick or even sub-μm in thickness. The nanoscale particles may be embedded in the dielectric layer in the form of a powder, for example.

Alternatively, the dielectric layer may contain a deformable, in particular fibrous and/or nanoscale, polymer network (for example consisting of fibers with diameters below 10 μm, preferably below 1 μm, most preferably below 100 nm) with the fluid embedded in the network. The network can have the form of a foam or a sponge-like structure, for example.

Concerning the dimensioning of the single layers of the DET-stack, it is of great advantage if the dielectric layer has a thickness of less than 100 μm, e.g. when using a high-permittivity ($\varepsilon_r > 50$) dielectric material such as BaTi-nano-particles for the dielectric layer, or preferably less than 2 μm, e.g. when using a low-permittivity ($\varepsilon_r < 50$) material such as nanoscale-fibrous-sponges (e.g. cellulose or alike) for the dielectric layer. Such designs are now possible due to the application of novel fabrication techniques, as will be detailed below.

The buffer layer(s), on the other hand may have a thickness that is in a similar range but preferably, the buffer layer(s) is/are even thinner than the dielectric layer.

In another embodiment, the elastic buffer layer(s) is/are made from a soft polymer, in particular with a Young's Modulus below 10 MPa, preferably below 2 MPa. Most preferably a functionalized siloxane based polymer may be used as the material for the elastic buffer layer; for example, the buffer layer can be made from polydimethylsiloxane (PDMS).

In particular designs, the buffer layer may show a thickness of less than 5 μm, preferably less than 2 μm, most preferably less than 400 nm. The fluid used in the dielectric layer may be a liquid, for example uncross-linked siloxane or silicone oil.

One design of a DET according to the invention with extremely high sensitivity can be obtained, if the dielectric layer and the buffer layer(s) all have thicknesses below 1 μm. In such a design, the inter-electrode-distance between the opposing electrodes can be below 3 μm, or even below 2 μm. Such ultra-thin designs are made possible by using the buffer layers, according to the invention, as will become clear, when explaining the fabrication process according to the invention.

In another preferred DET design, at least one of the buffer layers or the buffer layer show/shows a nanoscale corrugation, for example in the form of nanoscale wrinkles or nanoscale ripples; alternatively, the nanoscale corrugation may result from in-situ crosslinked, in particular electro-sprayed, nano-droplets of the buffer layer material. The height of the nanoscale corrugations can be in the order of the buffer layer thickness, for example a few hundreds of nanometers (sub-micrometer). In such a design, in particular a surface of the buffer layer facing the dielectric layer may be corrugated. If the amplitude of the nanoscale corrugation is in the same order of magnitude as the thickness of the buffer layer, the increase in flexibility of the buffer layer will be significant.

Alternatively or additionally, the buffer layer may repeat a nanoscale corrugation of one of the electrodes and/or covers sidewalls of one of the electrodes. By such measures, first, the interaction between the buffer layer and the dielectric layer is enhanced and second, the life-time of the DET-structure can be increased. Using nanoscale corrugations is also an approach for fine-tuning the mechanical stiffness of the electrodes and the buffer layers.

In all of the above designs featuring a nanoscale corrugation of the buffer layer, it is of great advantage for achieving a large relative capacitance change of the DET, if the dielectric layer penetrates into the corrugation of the buffer layer. This approach can also increase the change of the relative permittivity of the dielectric layer and thus result in an increased sensitivity of the DET.

In yet another advantageous embodiment, both of the two opposing electrodes show similar nanoscale corrugations, and preferably, these corrugations are repeated by the respective buffer layers arranged on said opposing electrodes, respectively. The effect of this design is an even higher sensor performance and a longer life-time of the DET.

For an ultra-thin design of the DET, it is preferable if at least one of the two opposing electrodes is a thin film electrode. Generally, for a high electro-mechanical performance it is preferable, if the electrodes, in particular the thin films, are of a metal or metal alloy.

In further designs, the at least one of the two opposing electrodes may show a thickness of less than 100 nm, preferably of less than 20 nm, most preferably of less than 10 nm.

For the long-term stability of the DET, it is of great advantage, if at least one of the two opposing electrodes is linked to said elastomer (introduced at the beginning) or another elastomer by way of an adhesion promoting film. In particular, said electrode may be embedded into the adhesion promoting film. Hence a matrix may be formed consisting of the electrode and adhesion promoting film, which can be used as a highly deformable electrode. The adhesion promoting film preferably consists of a functionalized PDMS film, for example a thiol-functionalized PDMS film; the thickness of such a film can be less than 100 nm, and is most preferably more than 10 nm. In case the electrode is embedded into the adhesion layer, the thickness of the resulting matrix may thus be between 100 nm and 10 nm.

According to another embodiment, at least one, preferably both, of the two opposing electrodes may be patterned as a network of electrically connected islands/clusters on the respective buffer layer. In such a case, each of the opposing electrodes can be patterned in such a way, that the electrode is embedded/incorporated in the elastomer or an adhesion promoting film (as explained above), which renders the electrode highly compliant. By such features, the electrode network may be deformed in various directions. In other words, the electrode(s) of the DET patterned as a network is/are rendered stretchable. In such an embodiment, it is highly preferable, when an areal portion of the islands is near the percolation threshold, in particular such that the resistivity of said electrode(s) formed by the network is strongly strain-dependant.

For a gold thin film for example, this may be accomplished by using a film thickness in the order of 7 nm. During elastic deformation, the electrode network can possibly be stretched below the percolation threshold, in which case, the network will not be conductive anymore. It is therefore preferably, when the density of the islands of the network is above the percolation threshold.

As will be explained in more detail below with reference to the figures, such a design offers the possibility of using the DET as a directional force sensor: When an electrode in the form of a network as described above is undergoing a deformation due to a pressure applied to the DET, the gaps between the electrically connected islands of the electrode may vary and this variation may be anisotropic (i.e. different variation along different axes). In consequence, the resistivity of the network used as an electrode of the DET will vary anisotropically. By determining the resistivity of the network along different axes, the deformation of the network may be estimated. From this estimation, conclusions can be drawn on the direction of the force acting on the DET.

Hence, by using at least one electrode patterned as a network near the percolation threshold, the DET is rendered into a highly sensitive directional force sensor.

The DET may also comprise a support substrate such as a plate or a flexible and/or stretchable foil. Preferably this support substrate may feature a microscale structure, for example it may be a micro-patterned foil. In such a design, the elastic buffer layer may be patterned onto the microscale structure of the support substrate. In this case, it can be of advantage if the support substrate shows a nanoscale corrugation and at least one of the two opposing electrodes is deposited onto the nanoscale corrugation of the support substrate. Such a design allows an increase of the effective area of the capacitor build up by the DET stack. Generally it is of advantage if the support substrate or the electrode surface, on which the buffer layer is deposited, shows a roughness with peak-to-peak values of less than 50 nm, preferably less than 20 nm. However, the surfaces on which the thin films forming the electrode or the buffer layer are to be deposited should show a minimum roughness (typically below 20 nm, but preferably more than 5 nm peak-to-peak) for improved adhesion of the films. Another benefit of an only limited surface roughness is that leakage currents, for example along local micrometer-scale defects through the buffer- and dielectric layers, can be avoided.

For long-term reliability an adhesive interface, e.g. a nanometer thin thiol-functionalized silicone layer, may be used to firmly link the electrically connected islands to the substrate, such that no deformation occurs even after numerous deformations of the DET.

For firmly linking the electrodes to the respective buffer layers and/or to a support substrate, the invention suggest the use of adhesion promoters. Efficient promoters according to the invention are thin metal layers, for example a thin film consisting of only a few atomic layers of chromium, or a few nanometer thick films of soft siloxane-based polymers with thiol or sulfhydryl end groups.

Finally, the invention also suggests a novel sensor with an array of dielectric elastomer transducers. In this array, each of the dielectric elastomer transducers may be formed as set forth by the claims directed towards a DET or as described before.

In such an array, neighboring DETs of the array may advantageously communicate with each other through the fluid embedded in or forming the dielectric layer, as will be explained in greater detail below with reference to the figures. By such a fluidic/pressure cross-talk between neighboring DETs of the array, a differential amplification and thus an increased spatial and absolute sensitivity of the DET-array can be obtained.

In accordance with the present invention, there is provided a specific utilization of a DET as described before or as set forth in the claims or of an array, as just described. According to this utilization, the DET or the array may be used as a directional force sensor.

For this purpose, at least one electrode of the DET/array may be patterned as a network of connected islands on the respective buffer layer, as has been described before.

In particular, when using a DET or array as described herein as a directional force sensor, a change of an electrical resistance of an electrode of the DET or the array due to an applied force may be spatially resolved using a dual-frequency measurement scheme. In such a scheme, two different measurement frequencies may be used for separating the spatial components of the resistivity change of the electrode, which can be patterned as a network near or at the percolation threshold.

Additionally or alternatively, a change of the capacitance of the DET or of single DETs of the array may be determined (typically at a frequency (e.g. 1 kHz) which is orders of magnitudes smaller than the frequency (e.g. 100 kHz) utilized for measurement of the resistivity of the network).

In accordance with the present invention, there is also provided a robust process, which solves the afore-mentioned problem. In particular there is provided a fabrication process for a DET comprising an elastic buffer layer separating a dielectric layer from an electrode, further characterized in that the buffer layer is deposited from a gas phase or a liquid phase. In the latter case (e.g. electro-spray deposition of PDMS dissolved in acetone), it may be preferable to deposit the buffer layer in the form of nanoscale droplets, as this allows easy formation of a nanoscale surface corrugation.

Additionally or alternatively, the novel process according to the invention may be characterized in that the buffer layer is cross-linked during deposition; such in-situ curing may be achieved, for example, by UV-irradiation during deposition from a gas or liquid phase.

In particular, the DET fabricated by such a process may be designed as outlined herein or as set forth by the claims directed towards a DET.

The process step described above may be referred to as "in-situ curing", as the buffer layer, which is preferably a polymer thin film, may be cured at the location where it has been deposited from the gas or liquid phase. The cross-linking can be achieved advantageously by a UV-exposure during deposition of the buffer layer. Both of these features enable a precise control of the growth of nm thick films (in particular control of the film thickness and amplitude and/or periodicity of the corrugation with nanometer-precision), as required for fabricating ultra-thin DETs according to the invention. Moreover, by employing UV-radiation and/or plasma, the intrinsic stress of the grown layers may be controlled, which allows controlled formation of nanoscale corrugations (see below).

Using a process as described above, at least one buffer layer of a DET according to the invention may be grown (e.g. from the gas or liquid phase) on the surface of a device directly. For example, the device may act as the support substrate of the DET, onto which an electrode and buffer layer is deposited; alternatively the surface of the device may act as one of the two opposing electrodes of the DET.

Such approaches allow the formation of a DET according to the invention directly on a surface of a device, which is comparable to coating the device with a skin. The DET may thus act as an artificial skin and may be used as a sensor measuring pressures or forces that are applied onto the device. In other words, according to the invention a DET may be formed on (and preferably firmly linked to) a surface of a device (in particular a medical device) to act as a sensory skin.

In particular a DET as described before, comprising two opposing electrodes, a dielectric layer sandwiched between said electrodes, and at least one elastic buffer layer separating the dielectric layer from one of the two opposing electrodes can be efficiently fabricated using the above process.

The fabrication process according to the invention may be further elaborated by forming a nanoscale corrugation. This can be done in particular by a plasma treatment or an irradiation with ultraviolet light. For example, the corrugation may be formed in the buffer layer directly. In other words, the buffer layer may form the corrugation in the resulting DET.

For increasing the total capacitance, the dielectric layer is preferably deposited on the nanoscale corrugation (in particular that of the buffer layer) while said buffer layer is preferably deposited onto the electrode that is separated from the dielectric layer by the buffer layer.

For reproducible sensor performance, it is generally recommended to deposit the buffer layer with a homogenous thickness, most preferably in such a way that the buffer layer deposited onto said electrode follows a nanoscale corrugation of the electrode. However, tailored corrugations with up to hundreds of nanometers in amplitude (e.g. as obtainable by plasma treatment or by electro-spraying and cross-linking of nanoscale droplets) can enhance the sensitivity of the DET.

The most accurate film definition may be achieved, by forming the buffer layer using molecular beam deposition or electro-spray-deposition. These deposition processes offer excellent control of the film thickness, in particular when controlled on-line (i.e. during the actual deposition), using spectroscopic ellipsometry or like methods. The dielectric layer may then be deposited onto said buffer layer. With this process, inter-electrode-distances in the order of 3 µm and less are achievable.

Preferred embodiments of the invention shall now be described in more detail, although the present invention is not limited to these embodiments: for those skilled in the art it is obvious that further embodiments of the present invention may be obtained by combining features of one or more of the patent claims with each other and/or with one or more features of an embodiment described or illustrated herein.

BRIEF DESCRIPTION OF THE DRAWINGS

With reference to the accompanying drawings, where features with corresponding technical function are referenced with same numerals even when these features differ in shape or design:

FIGS. 1A-1C illustrate a fabrication process for a first embodiment of a DET according to the invention, FIGS. 2A-2E illustrate a fabrication process for second embodiment of a DET according to the invention, FIGS. 3A-3E illustrate a fabrication process for third embodiment of a DET according to the invention, FIGS. 4A-4E illustrate a fourth embodiment of a DET according to the invention, FIGS. 5A-5E illustrates a fifth embodiment of a DET according to the invention, FIG. 7A illustrates two neighboring DETs according to yet another embodiment of the invention without applied force, while FIG. 8A illustrates two neighboring DETs according to an alternative embodiment of the invention without applied force, while FIG. 11A illustrates the capacitance change ΔC caused by a deformation of the dielectric layer after applying external pressure, FIG. 11B illustrates the sensitivity given as the derivation of the capacitance changes, FIG. 12 illustrates the relative capacitance change with respect to the applied pressure of a sprayed fibre network.

DETAILED DESCRIPTION

Figure 6:
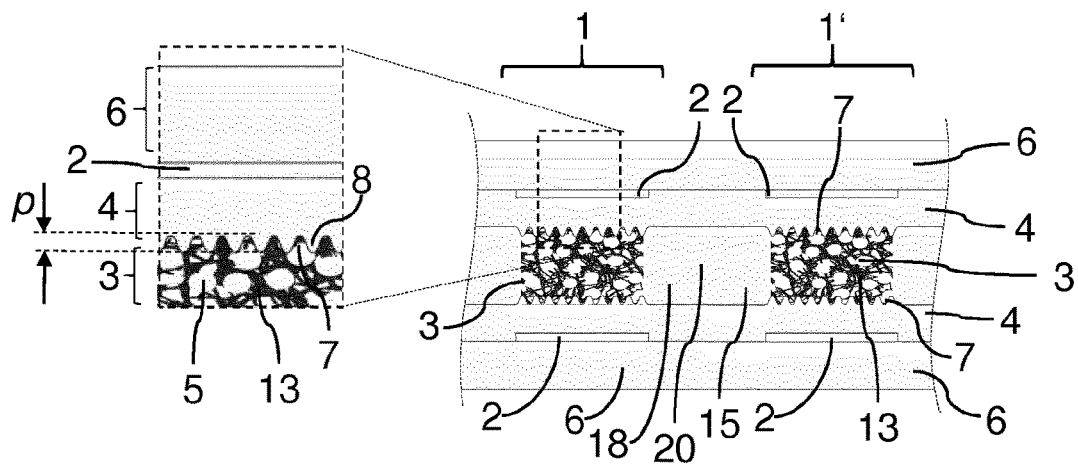
FIG. 6 illustrates a sixth embodiment of a DET according to the invention.

FIGS. 1A-1C describe the fabrication of a DET 1 according to the invention. The DET 1 consists of two sub-stacks 11 and 11', each consisting of a support substrate 6, 6' (for example 5-250 μm thick PEN- or PET-foil), a thin film metal electrode 2, 2' (7-30 nm gold, e.g. 20 nm gold) and a buffer layer 4, 4' (50-900 nm thick PDMS film). The figure, however, is not to scale. In practice, the thickness of the layers between the electrodes 2 patterned on the support substrate 6 may be 100 times or even 1000 times smaller than a lateral dimension of the electrodes 2. Due to the fact, that both electrodes 2 and 2' are applied on an elastomer 22 (the buffer layers 4 and 4', respectively), the DET 1 as a whole is highly deformable.

As shown by the process steps in FIGS. 1A-1C, an electrode 2 is deposited on the support substrate 6 as a thin film of uniform thickness, followed by deposition of a PDMS-thin film acting as the buffer layer 4. The PDMS thin film can be deposited using molecular beam deposition or electro-spray-deposition. For accurate control of the film thickness, the deposition may be monitored on-line using spectroscopic ellipsometry or other usable techniques.

Next, a dielectric layer 3 is formed by depositing nanoscale particles 12 of BaTiO$_3$ (permittivity $\varepsilon_r$>1200) with a maximum diameter of 50 nm in a film of a thickness in the order of 200 nm to 1 μm on top of the buffer layer 4.

The DET 1 can be finally assembled by stacking a second sub-stack 11' (fabricated in a similar fashion as sub-stack 11) on top of the dielectric layer 3 of the sub-stack 11. The resulting DET may thus offer an ultra-small inter-electrode-distance 10 of less than 1.5 μm or even below 1.0 μm.

An alternative to stacking of two sub-stacks 11, fabricated in a similar fashion, is the deposition of a second buffer layer onto a dielectric layer, which is already deposited onto a first buffer layer or onto an electrode. Hence, according to the invention, a buffer layer 4 may be grown on an already deposited dielectric layer 3. Following this approach, DETs with multiple dielectric layers 3, in particular separated from each other by intermediate electrodes, may be formed. Such stacked-dielectric-layer-designs are more complex to fabricate but appear to offer advantages in terms of sensitivity (over a broadened pressure range) or actuation range, in particular when employing the DET 1 as an electro-mechanical micro-actuator.

As depicted in FIG. 1A, the buffer layer does not show a corrugation but a smooth surface. Nevertheless, when a load 16 is applied to the DET 1 resting on a firm surface 14, the nanoscale particles 12 can penetrate into the elastic buffer layer 4. The illustrated penetration depth p (c.f. FIG. 1C) may be in the order of the diameter of the particles, for example 50 nm. Even more important, there is a fluid (air) embedded in between the nanoscale particles that is compressible. All of these factors lead to a significant compression of the dielectric layer and an increase of the volume fraction of the nanoscale particles in the volume between the two opposing electrodes. As a result, the capacitance of the DET changes significantly.

FIGS. 2A-2E describe the fabrication of yet another DET 1 according to the invention. This DET 1 consists of two sub-stacks 11 and 11', each consisting of a support substrate 6, 6' formed from an elastomer 22 (500 μm stretchable PDMS film), a thin film metal electrode 2, 2' (7-20 nm gold film, deposited on a 2-3 nm thick adhesion promoting film) and a buffer layer 4, 4' (50-200 nm PDMS). The buffer layers 4 and 4' as well as the dielectric layer 3 all show a sub-micrometer thickness resulting in a very high nominal capacitance of the DET 1 in the order of 1 nF/cm$^2$.

The first process step consists in the formation of a nano-scale surface corrugation 7 with a depth in the order of 20 to 50 nm by applying a plasma 17 to the support substrate 6.

By depositing an approximately 3 nm to 100 nm thick film of PDMS with thiol functionalized end groups an adhesion promoting film is formed. This polymer thin film may not be cross-linked.

Next, gold is evaporated onto the surface corrugation 7 of the support substrate 6 as a thin film of homogenous thickness. As indicated, the resulting electrode 2 thus covers the sidewalls 9 of the corrugation 7 and forms a similar corrugation 7.

Next, a 50-200 nm thick PDMS film is deposited by molecular beam deposition and cured in-situ by a suitable UV-exposure. Due to this particular process step, the deposited PDMS can follow even a nanoscale surface topography. Hence, the PDMS-buffer layer 4 repeats the corrugation 7 of the electrode 2 and forms nanoscale ripples 8.

Again the dielectric layer 3 is formed on top of the buffer layer 4 by depositing nanoscale particles 12. The resulting porous dielectric layer 4 shows nanoscale voids 5. These voids 5 are filled by applying a liquid acting as the fluid 15 of the DET 1 to the porous dielectric layer 4.

When applying a load 16 to the DET 1 shown in FIG. 2E, the fluid 15 is squeezed out laterally such that the inter-electrode-distance 10 between the two opposing electrodes 2 and 2' decreases, resulting in an increase of the capacitance of the DET 1.

FIGS. 3A-3E illustrate another possible design of a DET 1 according to the invention. The process steps in FIGS. 3A-3C and corresponding materials are identical to those of FIGS. 2A-2C. However, the dielectric layer 3 is composed of an elastic and deformable polymer network 13 with a liquid, or in the simplest case air, embedded in the network 13 (and acting as the fluid 15).

As illustrated, the network 13 forms nanoscale voids 5, which are filled by the fluid 15. By tailoring the porosity of the fiber network 13, the resolution of the DET 1 in terms of resolvable pressure in Pa can be fine-tuned. Likewise, the viscosity of the liquid used as the fluid 15 of the DET influences the sensitivity as well as the temporal response of the DET.

The resulting working mechanism of the DET 1 of FIG. 3E is thus identical to the DET 1 of FIG. 2E: when a force 16 is applied, the liquid is squeezed out of the polymer network 13 and hence the DET 1 is compressed. When the force 16 is removed, the polymer network 13 delivers a restoring force, which helps the DET 1 in regaining its initial shape.

FIGS. 4A-4E illustrate a possible fabrication process for a DET 1 according to the invention. Based on a support substrate 6, which may be a 500 μm thick film of stretchable PDMS or a 50 μm thick and flexible PET-foil as examples, the first step, illustrated by FIG. 4b, is the formation of a flat electrode 2 by evaporation of 7 to 20 nm of gold. For improving the adhesion of the electrode on the support substrate 6, an adhesion promoter such as a 3 nm thick film of thiol functionalized PDMS may be used.

The electrode 2 is next (c.f. FIG. 4C) sealed by a buffer layer 4 consisting of a 50 nm to 500 nm thick layer of PDMS deposited either from the gas phase or by electro-spraying from the liquid phase (or solved state); for example electro-spraying of nanoscale droplets of the buffer layer material may be performed. It may be noted from FIG. 4E, that the surface of each of the buffer layers 4 facing the dielectric layer 3 is flat (i.e. shows no surface corrugation).

As depicted in FIG. 4D, the dielectric layer 3, which is next deposited onto the buffer layer 4, may comprise nanoscale particles 12 and/or, in particular as a combination, a polymer network 13. These two variants for the dielectric layer are considered exchangeable. However, in particular when a high restoring force is required, a polymer network 13 may show advantages over a dielectric layer 3 comprising nano-particles 12. In particular when employing a combination of a polymer network 13 and nano-particles 12 as the dielectric layer 3, as illustrated in FIG. 4e, a common fluid 15 or two different fluids 15 may be embedded in the dielectric layer 3 of the DET 1. For example, it is generally possible to use a combination of air as a first fluid and a liquid as a second fluid as two different fluids embedded in the dielectric layer 3.

FIGS. 5A-5E illustrate yet another possible fabrication process for a DET 1 according to the invention, very similar to that of FIGS. 4A-4E; in particular this design employs flat electrodes 2 as the opposing electrodes. The main difference to FIGS. 4A-4E 4 is that in the process step shown in FIG. 5C, a nanoscale surface corrugation is formed in the buffer layer 4.

For example, when using PDMS as the material for the buffer layer 4, a silica-film may be formed at the surface of the buffer layer 4, for example by plasma or ultraviolet/ozone treatment. As the thermal expansion coefficient of such a silica-film is several order of magnitudes lower than that of der underlying bulk PDMS, a surface can be obtained that exhibits a nanoscale corrugation.

An alternative approach for forming a nanoscale surface corrugation in the buffer layer 4 is the deposition of nanoscale droplets of the buffer material itself. Such droplets may be formed by electro-spray deposition. As a result, the surface of the buffer layer 4 facing the dielectric layer may show a surface roughness resulting from the deposition of the nanoscale droplets.

In both of the above approaches, UV-light may be applied during deposition of the buffer layer material to achieve cross-linking. In consequence, the surface area of the buffer layer 4 is increased by the corrugation. As a result, more space for deformations of the dielectric layer 3 is formed and the buffer layer 4 is rendered highly flexible, in particular if an amplitude of the nanoscale corrugation 7 is in the same order of magnitude as the thickness of the buffer layer 4 (which may be a sub-micrometer thick thin film).

Generally speaking, in preferred embodiments, the buffer layer may be formed as a thin film showing an intrinsic compression. The effect of the intrinsic compression can be the formation of a nanoscale surface corrugation, in particular in the form of wrinkles. For example, it is perceptible in FIG. 5E, that the surface of each of the buffer layers 4 facing the dielectric layer 3 is corrugated. Such a particular design is highly advantageous for achieving a high flexibility of the buffer layers 4, and of particular advantage, when a stretchable support substrate 6 is used for the DET 1.

As shown in FIG. 5D, the dielectric layer 3 of the DET 1, which is capable of absorbing a fluid 15, may be deposited on and into the nanoscale corrugation 7 of the buffer layer 4. Again, a combination of nano-particles 12 and a polymer network 13 can be used as the dielectric layer 3, in particular in the form of a mixture.

FIG. 6 illustrates yet two other DETs 1 and 1' according to the invention. In this design, flat electrodes 2 are employed along with nanoscale corrugations 7, which are formed in the surfaces of the respective buffer layers 4 facing the dielectric layer 3, which is sandwiched between two opposing electrodes 2.

In the embodiment shown in FIG. 6 (as in FIGS. 3A-3E), the dielectric layer 3 is formed by a polymer network 13 that features minute fluid 15 filled nanoscale voids 5, as illustrated by the detailed inset on the left side of FIG. 6. Also visible from the inset is that the thickness of the buffer layers 4 is less than the thickness of the dielectric layer 3 and that each buffer layer 4 separates the electrode 2 from the dielectric layer 3.

In between the two DETs 1 and 1', an open micro-cavity 18 is formed in the same layer, in which the polymer networks 13 are arranged. The micro-cavity 18 is thus delimited by the two buffer layers 4 and filled with the same fluid 15 as the nanoscale voids 5 of the networks 13. As the micro-cavity 18 directly adjoins the dielectric layer 3, the micro-cavity 18 forms a receptacle 20 into which the fluid 15 in the polymer network 13 can be displaced (laterally), when, for example, the left DET 1 is compressed.

As the support substrates 6 as well as the buffer layers 4 are elastic, the receptacle 20 is reversibly deformable and can thus take up variable amounts of the fluid 15, when one of the DETs 1 is deformed by an external load.

Figure 7A:
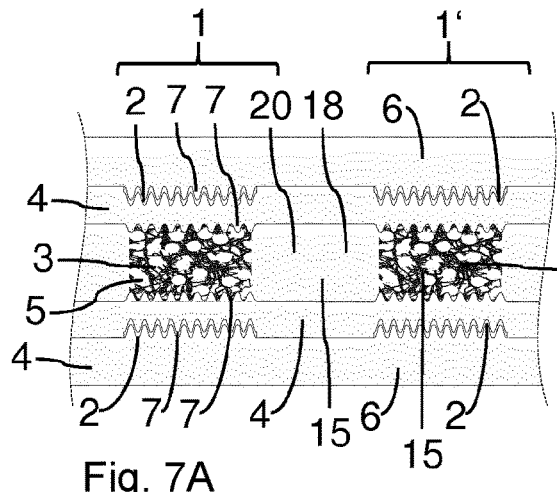

Such a situation is shown by the FIGS. 7A and 7B and 8A and 8B, respectively, which illustrate two alternative embodiments of DETs 1 according to the invention:

The DETs 1 shown in FIG. 7a differ from the DET 1 shown in FIG. 6 in the fact that the thin film electrodes 2 are patterned onto nanoscale corrugations 7, which are formed on an inner surface of the respective support substrate 6, respectively. In addition, a flexible and stretchable support substrate 6 is employed, which enhances the cross-talk (c.f. below) between the neighboring DETs 1 and 1'.

Figure 7B:
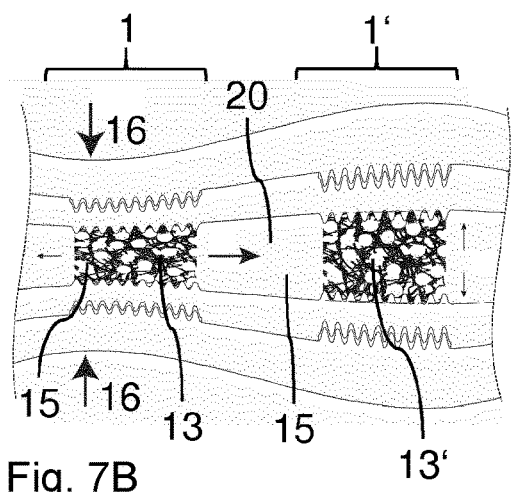
FIG. 7B illustrates the DETs of FIG. 5a after application of a force.

As illustrated by FIG. 7B, when a force 16 is applied to the left DET 1, the polymer network 13, forming a reversibly compressible dielectric layer 3, is compressed and the fluid 15 contained in the nanoscale voids 5 of the network 13 is driven/flowing into the receptacle 20, which expands accordingly. Moreover, also the neighboring polymer network 13' takes up some of the fluid 15 squeezed out of the polymer network 13 of the left DET 1. As a result, the left DET 1 is compressed while the right DET 1' expands. This fluidic cross-talk between the neighboring DETs 1 and 1' results in differential signal amplification, because the capacitance of the left DET increases, while the capacitance of the right DET 1' decreases.

The amount of the crosstalk is dependent on the elastic properties of the support substrate 6 as well as the buffer layers 4; it will be stronger when a stretchable PDMS membrane (c.f. FIGS. 7A and 7B) is used as the support substrate 6 as compared to using weakly bendable PEEK- or PET-foils for the support substrate 6 (c.f. FIG. 6).

Figure 8A:
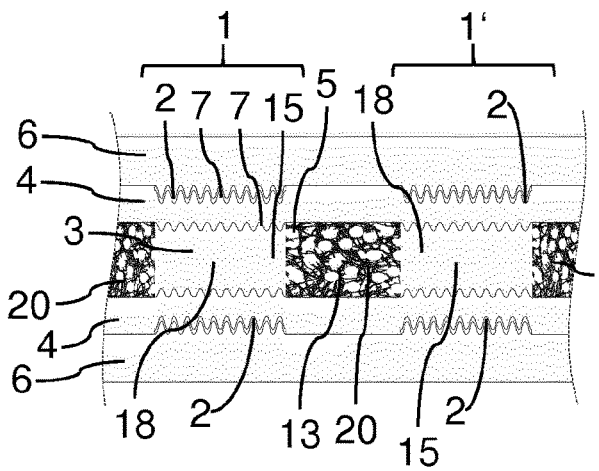
Figure 8B:
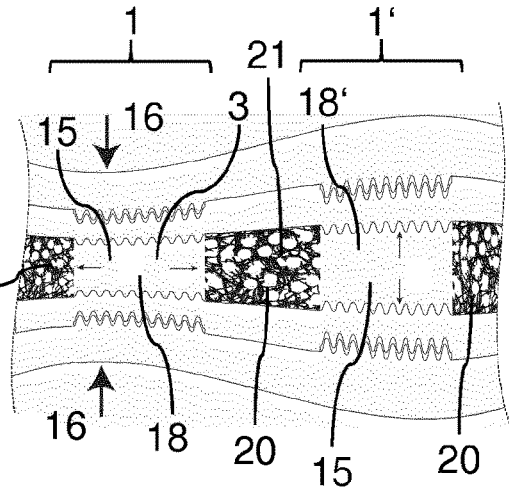
FIG. 8B illustrates the DETs of FIG. 6a after application of a force.

A similar pressure- or fluidic crosstalk between neighboring DETs 1 and 1' is shown in FIG. 8B. However, the DETs 1 of FIGS. 8A and 8B are dedicated to resolving applied load in the order of a few Pa. Therefore, very thin and stretchable membranes are used as the support substrate 6 and the DETs 1 do not feature a porous dielectric layer 3 as the DETs 1 shown in FIG. 6 or 7A. Instead, the dielectric layer 3 sandwiched between the opposing electrodes 2 in FIGS. 8A and 8B is consisting entirely of a fluid 15, namely air, which is compressible. In other words, the DETs 1 each feature a fluid filled (and laterally open) micro-cavity 18 sandwiched between the two opposing electrodes 2. The polymer network 13 located in between the two DETs 1 and 1' is not sandwiched between opposing electrodes but serves as a receptacle 20 that communicates with the dielectric layer 3, which is made up by the fluid-filled micro-cavity 18.

When a force 16 is applied to such a DET 1, as illustrated in FIG. 8B, the fluid 15 itself sandwiched between the two opposing electrodes 2 is compressed. Additionally, due to the low stiffness of the complete DET 1, in particular the support substrates 6, the fluid 15 is displaced into the receptacle 20. Moreover, the fluid 15 is driven even into the second micro-cavity 18' such that the neighboring DET 1' expands accordingly. As a result of all of these effects, a very high sensitivity is achieved with this particular design.

The receptacle 20 in FIGS. 8A and 8B is made up by a fibrous polymer network 13, which expands, as soon as the fluid 15 is driven into the receptacle 20. The network 13 thus acts as a spring-like stabilizer/a resilient member 21 and contracts, as soon as the external force 16 is removed. As a result, the fluid 15 is driven back from the receptacle 10 into the micro-cavity 18 (thus expanding the volume enclosed between the two opposing electrodes 2), as soon as the force 16 is removed, due to the shape-restoring force of the polymer network 13.

Figure 9:
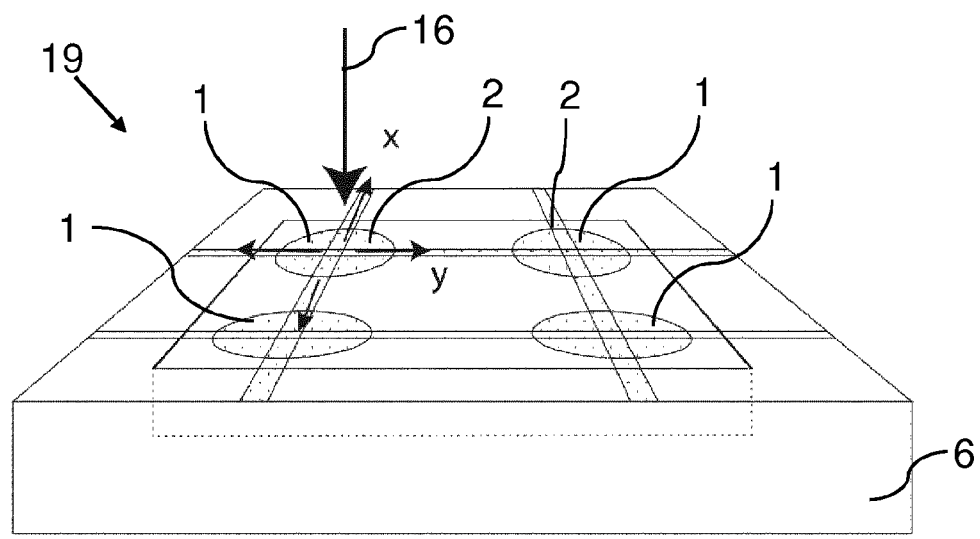
FIG. 9 illustrates an example of an array of DETs according to the invention with a normal force acting on one of the DETs of the array.
Figure 10:
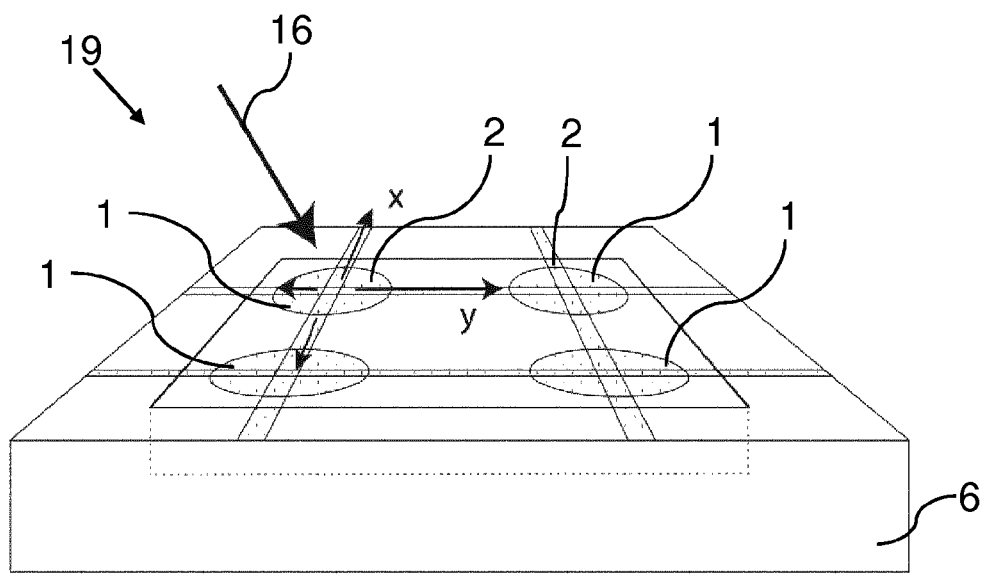
FIG. 10 illustrates a similar array of DETs as in FIG. 7 but now with a force applied at an angle with respect to an outer surface of the array.

Finally, FIGS. 9 and 10 depict a 2×2-array 19 of four DETs 1 according to the invention. Each DET 1 offers a circular sensing field, indicated by the dotted areas, which represent an electrode layer of the array 19.

When a normal force 16 is applied to one of the DETs 1 of the array 19, as depicted in FIG. 9, the DET 1 on which the force is applied ("central DET") is strained isotropically in the x- and the y-direction, as indicated by the four arrows in the figure.

The central DET 1 may communicate with neighboring DETs 1 by way of a fluid 15 embedded in the dielectric layer 3 (as was discussed with respect to FIGS. 7A and 7B) or by way of a fluid 15 forming the dielectric layer 3 directly (as was discussed with respect to FIGS. 8A and 8B). As already discussed, the fluid communication results in a pressure cross-talk between the DETs 1, such that the capacitance of the central DET 1 to which the normal force 16 is applied will increase, whereas the capacitance of the peripheral DETs 1 surrounding the central DET 1 will decrease. As a major effect of such a design, the spatial sensitivity and/or resolution of the array 19 is greatly increased.

FIG. 10 illustrates another possible utilization of a DET-array 19 for directional force sensing, in accordance with the invention. In this design, one of the electrodes 2 of each of the DETs 1 of the array 19 is patterned on a deformable and/or elastic buffer layer 4 as a network of electrically connected islands near or at the percolation threshold of the material used for the electrode layer. When a force 16 is applied to one of the DETs 1 of the array 19 at an angle with respect to an outer surface of the DET 1, the buffer layer 4 and the electrode 2 patterned as a network on top of the buffer layer 4 will be strained anisotropically.

Other than a uniform electrode, the electrode network offers the required deformability such that the electrode network will change anisotropically. The anisotropic strain may be detected by measuring the resistance of the electrode layer in different directions (for example in the x- and y-direction in FIG. 10). For example it is well-known that by using different measurement frequencies, the spatial components of the change of the electrical resistance of the electrode may be extracted.

As depicted in FIG. 10, the strain in the y-direction may be greater than in the x-direction, due to a higher stress input in that direction resulting from the applied force 16. As a result the change of the resistance of the electrode layer in the y-direction may be greater than in the x-direction. Generally speaking, the higher the stress input in a certain direction, the higher the change of the electrical resistance in that specific direction will be.

Using a dual-frequency measurement scheme, the electrode pads of the array 19 can be electrically scanned at two different frequencies: for example at 1 kHz for detecting capacitance changes on a timescale of ms and at 100 kHz for detecting the resistivity of the electrode pads.

In conclusion, in a DET-array 19 according to the invention, a normal force component (as depicted in FIG. 9) may be extracted by measuring the capacitance change of a central DET 1 (to which the force is applied) and possibly also from the capacitance changes of neighboring, peripheral DETs 1. Additionally, an in-plane component of an applied force 16 (corresponding to the situation of FIG. 10) may be extracted by spatially resolved measurements of the resistivity change of at least one electrode of the central DET 1 of the array, on which the force is applied. This approach allows a single DET 1 or an array 19 of DETs 1 to be used as an absolute and/or directional force sensor.

Of course, it is also possible to sense a pressure distribution acting on the top surface of the DET-array 19 by measuring the capacitance and/or resistances of single DETs 1 of the array 19.

In an advantageous embodiment the dielectric layer comprises a fiber network. This fiber network can comprise polymer, organic or inorganic fibers, which can be sprayed. Applying external pressures, the deformation of the dielectric layer causes a capacitance change $\Delta C$. FIG. 11A shows the sensor response over six orders of magnitudes of applied pressures. The high resting capacitance of tens to hundreds of pF/cm2 enables simplified microelectronics. FIG. 11B exhibits the sensitivity, given as the derivation of the capacitance changes. The highest sensitivity of 6 kP−1 is found for small pressure of a few Pa. However, this pressure range can be shifted based on the design of the sensing heterostructure to the pressure range of interest for the application, see FIG. 12.

FIG. 12 shows the relative capacitance change with respect to the applied pressure. With increasing pressures the sensitivity, given as 1st derivation of the relative capacitance change, decreases. Two distinct pressure ranges with different linear dependencies can be found. The range of high sensitivity is given by the deformation of the porous fiber network at low pressures from Pa to kPa while reduced sensitivities relate to the deformation of the incompressible elastomer buffer layers. Based on the design of the fiber-network/buffer-layer heterostructure this behavior can be tuned, e.g. with different fiber network thicknesses based on a variation of spray time from 2 s to 20 s.

In summary, for improving the sensitivity, lifetime and energy consumption of a dielectric elastomer transducer 1, in particular to be used as a sensor, it is suggested that a dielectric layer 3 enclosed by two electrodes 2 of the transducer 1 comprises a nanoscale (i.e. in the order of nL, for example 1 mm$^2$×5 µm=5 nL) volume of a fluid 15 such that the dielectric layer 3 is rendered compressible and/or displaceable out of a volume enclosed by the two electrodes 2. The advantage of such a design is that, although the dielectric layer 3 and possible buffer layers 4 separating the electrodes 2 from the dielectric layer 3 may all have thicknesses in the order of a few μm or even in the sub-μm range, the transducer 1 is rendered highly compliant due to the movability of the fluid 15. In consequence, a large nominal capacitance of the transducer 1 can be achieved in conjunction with a very high sensitivity.

LIST OF REFERENCE NUMERALS 1 dielectric transducer (DET)
2 electrode
3 dielectric layer
4 buffer layer
5 void
6 support substrate
7 nanoscale corrugation
8 ripples
9 sidewall (of 7)
10 inter-electrode-distance
11 sub-stack
12 nanoscale particles
13 polymer network
14 surface
15 fluid
16 force (e.g. a mechanical load)
17 plasma (and/or exposure to UV-wavelengths)
18 micro-cavity
19 array of DETs
20 receptacle
21 resilient member
22 elastomer

The invention claimed is:

1. A sensor with a dielectric elastomer transducer (1), comprising:
   a dielectric layer (3) sandwiched between two opposing electrodes (2),
   at least one of the two electrodes (2) is applied on an elastomer (22), and
   the dielectric layer (3) contains a fluid (15) within a volume that is occupied by the dielectric layer (3).

2. The sensor as claimed in claim 1, wherein the dielectric layer (3) is at least one of compressible or laterally displaceable.

3. The sensor as claimed in claim 1, wherein the dielectric layer (3) is separated from at least one of the two opposing electrodes (2) by an at least one of elastic or deformable buffer layer (4), and the at least one in the buffer layer is at least one of dielectric, electrically conducting, or elastically incompressible.

4. The sensor as claimed in claim 1, wherein the dielectric layer (3) is at least one of porous, including nanoscale voids (5) which are filled by the fluid (15), or is reversibly compressible.

5. The sensor as claimed in claim 1, wherein the dielectric layer (3) consists of a fluid (15), or the transducer (1) comprises at least one receptacle (20) in fluid communication with the dielectric layer (3) into which the fluid (15) is displaceable, or the dielectric layer (3) consists of the fluid (15), and the transducer (1) comprises the at least one receptacle (20) in fluid communication with the dielectric layer (3) into which the fluid (15) is displaceable.

6. The sensor as claimed in claim 1, wherein the dielectric layer (3) contains nanoscale particles (12) with a diameter of less than 500 nm, or the dielectric layer (3) contains or comprises a deformable fibre network (13) with the fluid (15) embedded in the network.

7. The sensor as claimed in claim 3, wherein the at least one buffer layer (4) is thinner than the dielectric layer (3), the fluid (15) is a liquid, or the at least one buffer layer (4) is thinner than the dielectric layer (3) and the fluid (15) is uncross-linked siloxane or silicone oil.

8. The sensor as claimed in claim 3, wherein the at least one buffer layer (4) is at least one of made from a soft polymer with a Young's Modulus below 10 MPa or has a thickness of less than 5 μm.

9. The sensor as claimed in claim 3, wherein the dielectric layer (3) and the buffer layer(s) (4) all have thicknesses below 1 μm, such that an inter-electrode-distance (10) between the opposing electrodes (2) is below 3 μm.

10. The sensor as claimed in claim 3, wherein the at least one buffer layer (4) includes a nanoscale corrugation (7) formed of nanoscale wrinkles or nanoscale ripples (8), and a surface of the buffer layer (4) facing the dielectric layer (3) is corrugated.

11. The sensor as claimed in claim 1, wherein at least one of the two opposing electrodes (2) has a thickness of less than 100 nm at least one of the two opposing electrodes (2) is linked to the elastomer (22) by an adhesion promoting film and said electrode (2) is embedded into the adhesion promoting film.

12. The sensor as claimed in claim 3, wherein at least one of the two opposing electrodes (2) is patterned as a network of electrically connected islands on the respective buffer layer (4), and said electrode is stretchable.

13. A method of sensing using a sensor according to claim 3 for directional force sensing, in which at least one electrode (2) of the transducer (1) or of an array (19) is patterned as a network of electrically connected islands on the at least one buffer layer (4), and at least one of a change of an electrical resistance of an electrode (2) or a change of a capacitance of the transducer (1) due to an applied force is spatially resolved using a dual-frequency measurement scheme.

14. A method of fabricating a dielectric elastomer transducer (1) according to claim 3, comprising separating a dielectric layer (3) from an electrode (2) using the elastic buffer layer (4), depositing the buffer layer (4) from at least one of a gas phase or from a liquid phase, preferably in the form of nanoscale droplets, and cross-linking the buffer layer (4) during deposition.

15. A sensor with a dielectric elastomer transducer (1), comprising:
   a dielectric layer (3) sandwiched between two opposing electrodes (2),
   at least one of the two electrodes (2) is applied on an elastomer (22),
   the dielectric layer (3) comprises fluid (15), and
   the dielectric layer (3) is at least one of porous, including nanoscale voids (5) which are filled by the fluid (15), or is reversibly compressible.

16. A sensor with a dielectric elastomer transducer (1), comprising:
   a dielectric layer (3) sandwiched between two opposing electrodes (2),
   at least one of the two electrodes (2) is applied on an elastomer (22),
   the dielectric layer (3) comprises fluid (15), and
   the dielectric layer (3) consists of a fluid (15), or the transducer (1) comprises at least one receptacle (20) in fluid communication with the dielectric layer (3) into which the fluid (15) is displaceable, or the dielectric layer (3) consists of the fluid (15), and the transducer (1) comprises the at least one receptacle (20) in fluid communication with the dielectric layer (3) into which the fluid (15) is displaceable.

* * * * *